United States Patent
Polley et al.

(10) Patent No.: US 11,307,267 B1
(45) Date of Patent: Apr. 19, 2022

(54) HALL SENSOR ANALOG FRONT END

(71) Applicant: TEXAS INSTRUMENTS INCORPORATED, Dallas, TX (US)

(72) Inventors: Arup Polley, Richardson, TX (US); Srinath M. Ramaswamy, Murphy, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/092,865

(22) Filed: Nov. 9, 2020

(51) Int. Cl.
*G01R 33/00* (2006.01)
*G01R 33/07* (2006.01)

(52) U.S. Cl.
CPC ..... *G01R 33/0041* (2013.01); *G01R 33/0094* (2013.01); *G01R 33/07* (2013.01)

(58) Field of Classification Search
CPC . G01R 33/0041; G01R 33/0094; G01R 33/07
See application file for complete search history.

(56) References Cited

U.S. PATENT DOCUMENTS

| 10,197,638 | B2 | 2/2019 | Polley et al. | |
|---|---|---|---|---|
| 10,698,066 | B2 | 6/2020 | Polley et al. | |
| 2007/0247141 | A1* | 10/2007 | Pastre | G01R 33/075 324/202 |
| 2013/0069640 | A1* | 3/2013 | Ausserlechner | G01R 33/077 324/251 |
| 2017/0363445 | A1* | 12/2017 | Polley | G01D 5/142 |
| 2019/0317175 | A1* | 10/2019 | Polley | G01R 33/0035 |

* cited by examiner

*Primary Examiner* — Alvaro E Fortich
(74) *Attorney, Agent, or Firm* — Michael A. Davis, Jr.; Charles A. Brill; Frank D. Cimino

(57) ABSTRACT

A system includes a first amplifier and a first Hall sensor group coupled to the first amplifier. The system includes a second amplifier and a second Hall sensor group coupled to the second amplifier, where the second Hall sensor group includes a spinning Hall group. The system includes a first demodulator, where the first demodulator input is coupled to the first amplifier output. The system includes a second demodulator, where the second demodulator input is coupled to the second amplifier output. The system also includes a subtractor, the first subtractor input coupled to the first demodulator output, and the second subtractor input coupled to the second demodulator output. The system includes a filter coupled to the subtractor output and to a second input of the first amplifier, and a calibration module coupled to the subtractor output.

25 Claims, 6 Drawing Sheets

HALL SENSOR ANALOG FRONT END

BACKGROUND

A Hall sensor (or Hall effect sensor) measures the magnitude of a magnetic field. Hall sensors usually include a strip or plate of an electrically conductive material with an electric current flowing through the plate. Responsive to the plate being positioned in a magnetic field such that a component of the field is perpendicular to the plate, an output voltage (e.g., a Hall voltage) is generated within the plate. The output voltage of the Hall sensor is directly proportional to the magnetic field strength through the Hall sensor.

SUMMARY

In at least one example, a system includes a first amplifier having a first amplifier output and first and second inputs. The system includes a first Hall sensor group coupled to the first input of the first amplifier. The system includes a second amplifier having a second amplifier output and a third input. The system also includes a second Hall sensor group coupled to the third input, wherein the second Hall sensor group includes a spinning Hall group. The system includes a first demodulator having a first demodulator output and a first demodulator input, the first demodulator input coupled to the first amplifier output. The system also includes a second demodulator having a second demodulator output and a second demodulator input, the second demodulator input coupled to the second amplifier output. The system includes a subtractor having a subtractor output and first and second subtractor inputs, the first subtractor input coupled to the first demodulator output, and the second subtractor input coupled to the second demodulator output. The system also includes a filter coupled to the subtractor output and to the second input of the first amplifier, and a calibration module coupled to the subtractor output.

In at least one example, a system includes a first Hall sensor group configured to provide a first Hall sensor signal responsive to an applied magnetic field. The system also includes a second Hall sensor group configured to provide a second Hall sensor signal responsive to the applied magnetic field, wherein the second Hall sensor group includes a spinning Hall group. The system includes a first amplifier coupled to the first Hall sensor group and configured to provide a first amplified signal responsive to the first Hall sensor signal. The system also includes a second amplifier coupled to the second Hall sensor group and configured to provide a second amplified signal responsive to the second Hall sensor signal. The system includes a first demodulator coupled to the first amplifier and configured to provide a first demodulated signal responsive to the first amplified signal. The system also includes a second demodulator coupled to the second amplifier and configured to provide a second demodulated signal responsive to the second amplified signal. The system includes a third amplifier coupled to the first demodulator and the second demodulator, and configured to provide a subtracted output signal responsive to a difference between the first demodulated signal and the second demodulated signal. The system also includes a filter coupled to an output of the third amplifier and configured to provide an offset correction signal to the first amplifier responsive to the subtracted output signal. They system includes a calibration module coupled to the output of the third amplifier and configured to provide a calibration signal responsive to the subtracted output signal, wherein the calibration signal is configured to calibrate a bias current source coupled to the first Hall sensor group.

In at least one example, a system includes a first amplifier configured to provide a first amplified signal responsive to a first Hall sensor signal from a first Hall sensor group. The system includes a second amplifier configured to provide a second amplified signal responsive to a second Hall sensor signal from a second Hall sensor group. The system also includes a first demodulator coupled to the first amplifier and configured to provide a first demodulated signal responsive to the first amplified signal. The system includes a second demodulator coupled to the second amplifier and configured to provide a second demodulated signal responsive to the second amplified signal. The system also includes a third amplifier coupled to the first demodulator and the second demodulator and configured to provide a subtracted output signal responsive to the first demodulated signal and the second demodulated signal. The system also includes a filter coupled to the third amplifier and configured to provide an offset correction signal responsive to the subtracted output signal, wherein the offset correction signal is configured to correct the first amplifier. The system includes a calibration module coupled to the third amplifier and configured to provide a calibration signal to a bias current source coupled to the first Hall sensor group responsive to the subtracted output signal. The system also includes a multiplexer configured to combine the first amplified signal and the second amplified signal and configured to provide an output signal.

In at least one example, a method includes providing a first bias current to a first Hall sensor group, and providing a second bias current to a second Hall sensor group. The method includes providing a first amplified signal responsive to a first Hall sensor signal from the first Hall sensor group. The method also includes providing a second amplified signal responsive to a second Hall sensor signal from the second Hall sensor group. The method includes providing a subtracted output signal responsive to a difference between the first amplified signal and the second amplified signal, wherein the subtracted output signal includes an offset correction signal and a bias control signal. The method also includes providing a corrected Hall signal responsive to the offset correction signal and responsive to the first amplified signal. The method includes adjusting the first bias current with the bias control signal.

DETAILED DESCRIPTION

Figure 1:
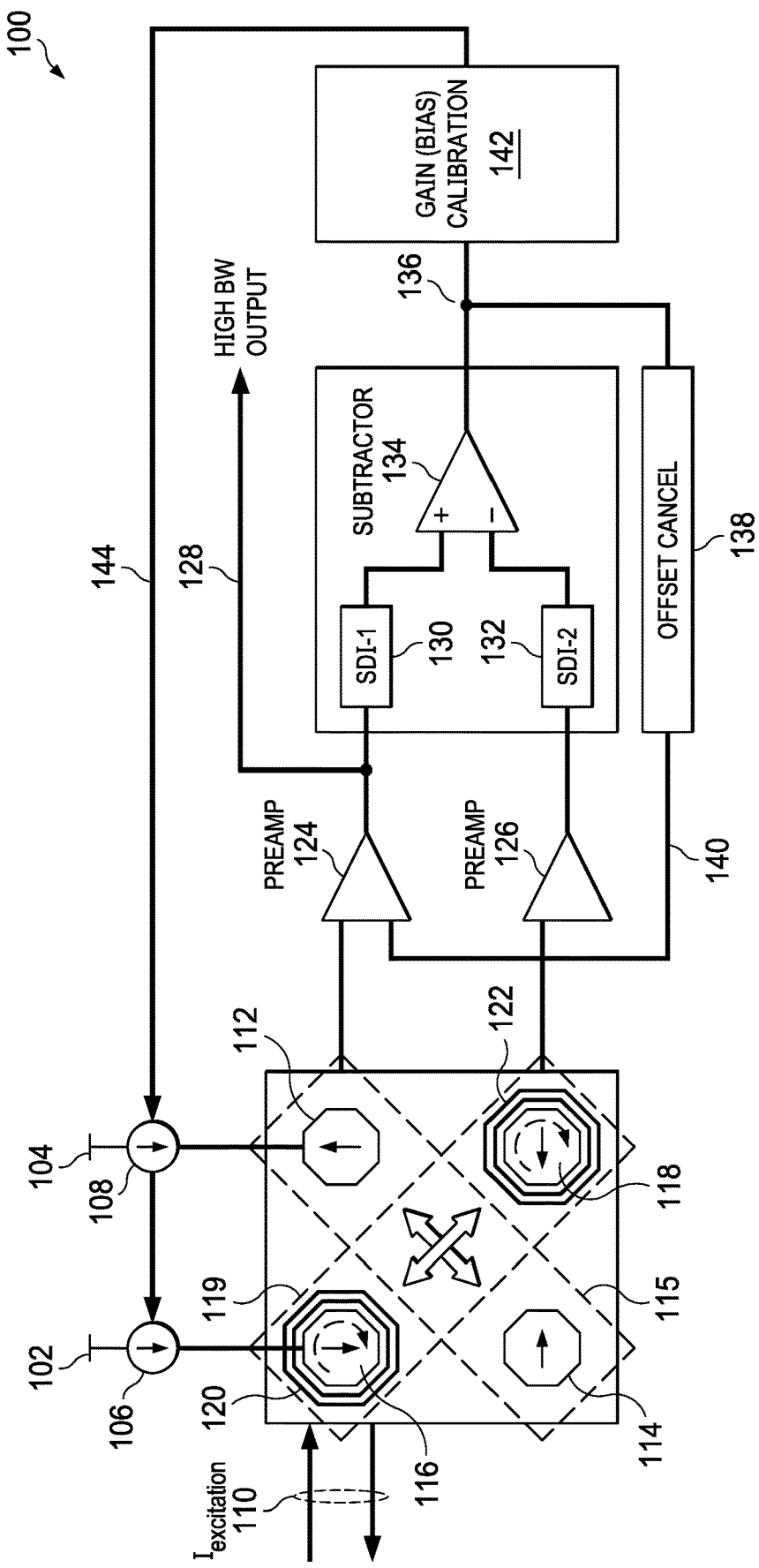
FIG. 1 is a schematic diagram of a Hall sensor system in accordance with various examples.

A Hall sensor converts a magnetic field to an electrical signal (e.g., an output voltage). The output voltage of the Hall sensor is directly proportional to the strength of the magnetic field passing through the semiconductor material of the Hall sensor. Hall sensors suffer from offset due to fabrication process variations such as mismatch, doping variations, and disadvantageous piezoelectric effects. The offset of a Hall sensor is equivalent to the voltage output of the Hall sensor if no magnetic field is present. The offset of a Hall sensor is an inherent quality and, for a single Hall sensor, is often sufficiently large to obscure the change in the voltage of a Hall sensor output signal that occurs responsive to an applied magnetic field. The offset may also drift depending on factors such as temperature, packaging, stress, variations, and aging.

A Hall sensor uses four terminals to take one measurement of the applied magnetic field, although the Hall sensor may have more than four terminals as described below. One way to model the resistances between the terminals of a Hall sensor is as a Wheatstone bridge resistor network with mismatches among the resistors. The resistance mismatches occur due to process variations or device aging. Because of these resistance mismatches, the offset voltage appears at the output of the Hall sensor even if no magnetic field is present.

A Hall sensor may be a thin piece of rectangular semiconductor material. A terminal is located on each of the four edges of the rectangle. A Hall sensor works by transmitting a bias current from a first terminal to a second terminal, where the first terminal is opposite the rectangle from the second terminal. If a magnetic field is present, the bias current and the magnetic field cause a potential difference to appear across the third and fourth terminals, which are also opposite one another. The third and fourth terminals are therefore perpendicular to the first and second terminals. If the resistances in the Hall sensor match, the voltage that appears across the third and fourth terminals is caused by the applied magnetic field (in the ideal case where resistances match, there is no offset voltage). However, because of the resistance mismatches described above, the voltage across the third and fourth terminals includes the voltage caused by the applied magnetic field along with the voltage offset.

A number of techniques are useful to account for the offset voltage. One technique is the use of a spinning current. Other Hall sensors, as described below and implemented in various examples, have eight, sixteen, or another number of terminals, although just four of the terminals are used at a time to receive one measurement of the strength of the magnetic field. With the spinning current technique, a bias current is applied at each of the different terminals in turn (for every terminal on the Hall sensor, whether there are four, eight, sixteen, etc.) and a voltage measurement is taken for each application of the bias current to a terminal, as described above. In a four terminal Hall sensor, after four voltage measurements are taken, the result of the four measurements is averaged and one output sample is received. For example, if the terminals on the edges of a rectangular Hall sensor are labeled 1, 2, 3, and 4, where terminal 1 is opposite terminal 2, and where terminal 3 is opposite terminal 4, a bias current is first applied to terminal 1. A voltage is measured across terminals 3 and 4 and stored as a first measurement. Second, the bias current is applied to terminal 3. A voltage is measured across terminals 2 and 1 and stored as a second measurement. Third, the bias current is applied to terminal 2. A voltage is measured across terminals 4 and 3 and stored as a third measurement. Fourth, the bias current is applied to terminal 4. A voltage is measured across terminals 1 and 2 and stored as a fourth measurement. Any appropriate circuitry is implemented to switch the bias current to the proper terminal and collect the voltage measurements.

Because a bias current is applied at each terminal and a voltage measurement is taken across each respective pair of terminals perpendicular to the bias current each time the bias current is applied, the offset voltage caused by resistance mismatches cancels out. For example, if a 0.1 V offset occurs between terminals 3 and 4, the measurement of the voltage between terminals 3 and 4 includes the voltage from the applied magnetic field and this 0.1 V offset voltage (e.g., the first measurement above). The measurement of the voltage between terminals 4 and 3 includes the voltage from the applied magnetic field and this offset voltage, measured as a −0.1 V offset (e.g., the third measurement above). These offset voltages will cancel if the four measurements are added together (0.1V+(−0.1V)=0). Likewise, any offset voltages measured across other pairs of terminals will cancel as well. If the four measurements are added and averaged to produce an output sample, the resulting output sample includes only the voltage caused by the magnetic field. In another example, for an eight terminal Hall sensor, eight measurements are taken, averaged, and one resulting output sample is received. Due to the averaging of the eight measurements, the offset voltage is also cancelled in this example.

However, the use of current spinning techniques substantially limits the bandwidth of a signal for providing the output voltage indicative of the magnetic field. The bandwidth is limited by factors such as the time used for bias current settling after the bias current is switched to each terminal, the clock speed of sample and hold times used for sampling output voltages, and the time used to determine the final output after the spinning technique is complete. For example, the time used to determine the final output can be the time used to accumulate four samples (or eight, sixteen, etc.) and calculate the average value of the samples.

One approach to increase the bandwidth of the Hall sensor is to use two Hall sensors in a circuit with two different paths. One Hall sensor has a spinning technique applied to it while the other Hall sensor does not. A low bandwidth path in the circuit uses the Hall sensor with the spinning technique and therefore has a low offset voltage. A high bandwidth path in the circuit uses the non-spinning Hall sensor and therefore has a high offset voltage. The signals on the high bandwidth path and the low bandwidth path are combined and the high offset voltage is removed. The result is a high bandwidth, low offset output signal.

Another challenge with existing Hall sensors is gain calibration. Gain calibration in Hall sensors is difficult because the gain depends on many different parameters, such as temperature, packaging stress, humidity, etc. A first approach is to create a table for all of these parameters and perform a correction. However, this approach becomes inaccurate as the number of parameters increases, and a multi-point calibration would have to be performed for each Hall sensor. A second approach is closed loop calibration. In closed loop calibration, a magnetic coil creates a known magnetic field on the Hall sensor. The Hall sensor output voltage is then compared with an expected response, and the sensor sensitivity/gain is adjusted to reduce the error between the sensor output and the expected response. A problem with closed loop calibration is that other magnetic fields may be created by other electrical currents, and those magnetic fields interfere with the known magnetic field applied to the sensor for calibration. Therefore the calibration may be inaccurate.

To address this problem of local magnetic fields interfering with closed loop calibration, a separate matched auxiliary Hall sensor is used to calibrate a primary Hall sensor. A closed loop calibration is performed on the auxiliary Hall sensor. The result of the closed loop calibration on the auxiliary Hall sensor is used to calibrate the primary Hall sensor. However, in this approach an external magnetic field can still cause interference.

Examples herein provide a Hall sensor analog front end circuit that addresses the issues described above. The Hall sensor analog front end circuits described herein exhibit active gain calibration, low offset, and high bandwidth (e.g., high speeds). First, examples herein provide for active gain calibration by using an auxiliary Hall sensor and a calibration signal on a feedback loop. Second, in examples, a spinning Hall sensor group provides a low offset output signal, while a non-spinning Hall sensor group provides a high bandwidth output signal. Therefore active gain calibration, low offset, and high bandwidth are each achieved. As described below, some examples herein also provide immunity to a low-frequency magnetic field, immunity to aliasing of a high frequency external magnetic field, and immunity to mismatch of multiple sensor groups.

FIG. 1 is an example of a Hall sensor system 100 that includes a spinning Hall sensor group, a non-spinning Hall sensor group, and calibration circuitry according to one example. In this example, four octagonal shaped Hall sensors are shown (e.g., each Hall sensor has eight terminals). In other examples, a different number of Hall sensors are used, and/or Hall sensors with different shapes are used, such as cross-shaped, square-shaped, circular, octagonal, etc. System 100 includes voltage sources 102 and 104 that are coupled to bias current sources 106 and 108, respectively. Bias current source 108 provides a first bias current I1 while bias current source 106 provides a second bias current I2. In an example, first bias current I1 is approximately equal to second bias current I2. Excitation signal 110 produces a calibrated magnetic field that impinges on certain Hall sensors to produce a calibration signal, as described below. The excitation signal 110 may be produced by any suitable mechanism, such as an excitation coil coupled to an AC current source in one example.

System 100 further includes a first Hall group H1 115. Hall group H1 115 includes two Hall sensors 112 and 114. Hall group H1 115 includes non-spinning matching Hall sensors 112 and 114. Non-spinning Hall sensors 112 and 114 provide a high bandwidth output signal. However, this high bandwidth output signal also includes a high voltage offset because no spinning technique is used to reduce the voltage offset. In other examples, a different number of Hall sensors are included in the non-spinning Hall group H1 115, such as one sensor or four sensors.

System 100 further includes a second Hall group H2 119. Hall group H2 119 includes two Hall sensors 116 and 118. Hall group H2 119 includes spinning matching Hall sensors 116 and 118. Hall sensor 116 is surrounded by a separate coil 120. Excitation signal 110 drives coil 120 to produce a calibrated magnetic field that impinges on Hall sensor 116 to produce a low bandwidth calibration signal (in conjunction with Hall sensor 118). Similarly, Hall sensor 118 is surrounded by a separate coil 122. Excitation signal 110 also drives coil 122 to produce a calibrated magnetic field that impinges on Hall sensor 118 to produce the low bandwidth calibration signal (in conjunction with Hall sensor 116). The low bandwidth calibration signal also has a low offset voltage, due to the spinning technique employed by Hall sensors 116 and 118. Hall group H2 119 therefore provides a signal with low bandwidth and low voltage offset. In other examples, a different number of Hall sensors can be included in the spinning Hall group H2 119.

Coils 120 and 122 may be fabricated on one or more conductive layers, such as metallic layers, that may be formed over the Hall sensors 116 and 118. The coils 120 and 122 may be positioned to be peripheral to each Hall sensor 116, 118 in some examples. In other examples, the coils 120, 122 may be positioned to partially or completely overlie each respective Hall sensor 116, 118. The magnitude of the calibration magnetic field is determined by the number of coils 120, 122 and the excitation signal 110 that is provided to the coils 120, 122. Different numbers of turns are useful in different examples. More turns produce a stronger magnetic field, but may also use a larger voltage excitation signal 110.

System 100 further includes preamplifier 124, preamplifier 126, high bandwidth output 128, sampler-demodulator-integrator 130 (SDI-1), SDI-2 132, subtractor 134, node 136, offset cancellation module 138, offset cancellation path 140, gain calibration module 142, and bias control path 144. The high bandwidth, high offset output from Hall group H1 115 is provided to an input of preamplifier 124. The preamplifiers 124, 126, as with the other preamplifiers described herein, are subtypes of amplifiers that amplify weak signals and transmit an amplified signal downstream for further amplification. Thus, preamplifiers are also referred to herein as amplifiers. The low bandwidth, low offset output from Hall group H2 119 is provided to an input of preamplifier 126. Hall group H1 115, preamplifier 124, and SDI-1 130 therefore include a high bandwidth, high offset path. Likewise, Hall group H2 119, preamplifier 126, and SDI-2 132 include a low bandwidth, low offset path. The low bandwidth path usually includes signals having a maximum frequency of $f_1$, whereas the high bandwidth path usually includes signals having a maximum frequency of $f_2$ (where $f_1 \ll f_2$). If the components in both paths are manufactured similarly, the paths usually have the same sensitivity and gain such that each path produces the same change in DC output if a DC magnetic field is applied. However, the waveform responses of the two sensor paths could be different because the bandwidth of each of the two sensor paths is different.

The output of preamplifier 124 is coupled to SDI-1 130. SDI-1 130 includes circuitry configured to provide N-phase sampling, demodulation, and integration of the high bandwidth signal from Hall group H1 115. N-phase sampling could include 2-phase, 4-phase, or any appropriate sampling. SDI-1 130 samples the Hall sensor outputs for the different current biasing configurations, as described above. After sampling, the high bandwidth signal is demodulated and integrated (e.g., added and averaged). In the demodulation step, SDI-1 130 multiplies the sampled signal for proper polarity (e.g., +1 or −1). For integration, SDI-1 130 adds all the samples corresponding to the different current biasing configurations to obtain an averaged output. After sampling, demodulation, and integration, the high bandwidth signal is provided to an input of subtractor 134.

An output of preamplifier 126 includes a low bandwidth output. The output of preamplifier 126 is coupled to SDI-2 132. SDI-2 132 includes circuitry configured to provide N-phase sampling, demodulation, and integration of the low bandwidth signal from Hall group H2 119. N-phase sampling could include 2-phase, 4-phase, or any appropriate sampling. After sampling, the low bandwidth signal is demodulated and integrated. After sampling, demodulation, and integration, the low bandwidth signal is provided to another input of subtractor 134.

Subtractor 134 subtracts the low offset signal (provided by the low bandwidth path) from the high offset signal (provided by the high bandwidth path) to provide a signal at node 136 that includes both a calibration component and an offset cancellation component. In some examples, subtractor 134 includes an amplifier that produces a subtracted output signal from two input signals. The low bandwidth, low offset path coupled to one input of subtractor 134 includes Hall group H2 119, preamplifier 126, and SDI-2 132. The high bandwidth, high offset path coupled to another input of subtractor 134 includes Hall group H1 115, preamplifier 124, and SDI-1 130.

Gain calibration module 142 receives the output signal from subtractor 134 and produces a bias control signal that is provided to bias control path 144. Gain calibration module 142 estimates the signal path gain from the known input magnetic coil (excitation signal 110) and the Hall sensor output. Gain calibration module 142 then computes a gain error from a target gain and controls the Hall sensor gain by changing the Hall sensor bias using a bias control signal. The bias control signal controls bias current source 108 in a manner that adjusts the magnitude of the first bias current I1 provided by bias current source 108. The gain of the respective Hall groups H1 115 and H2 119 depends on the magnitude of the respective bias currents I1 and I2. A larger bias current results in a higher Hall sensor gain. The feedback signal from gain calibration module 142 along bias control path 144 adjusts bias current source 108 to stabilize the signal at node 136 over a range of operating temperatures, process variations, and package stresses. Also, bias current source 106 is configured to match bias current source 108 and adjust the output of Hall group H2 119 over the same range of operating temperatures, process variations, and package stresses.

The offset cancellation signal component of the signal at node 136 is provided to offset cancellation module 138. Offset cancellation module 138 provides an offset cancellation signal to an input of preamplifier 124 via offset cancellation path 140. In some examples, offset cancellation module 138 includes a low-pass filter. In some examples, the low-pass filter passes signals below approximately 1 kHz. In other examples, offset cancellation module 138 includes a notch filter at the calibration signal frequency. The offset cancellation signal component of the signal at node 136 can be characterized as the difference between the high offset and the low offset ($Off_{high}-Off_{low}$). Because $Off_{low}$ is measured more accurately than $Off_{high}$ (due to the spinning current technique used to generate $Off_{low}$), the offset cancellation signal is used to generate an accurate estimation of $Off_{high}$. Offset cancellation module 138 therefore generates this accurate estimation of $Off_{high}$, and that estimation of $Off_{high}$ is fed back to preamplifier 124 via offset cancellation path 140.

Preamplifier 124 receives the estimation of $Off_{high}$ and subtracts $Off_{high}$ from the Hall voltage signal provided to preamplifier 124 by Hall group H1 115 (e.g., the high bandwidth signal). By subtracting the high offset signal, preamplifier 124 provides a high bandwidth, low offset signal at the output of preamplifier 124 (e.g., high bandwidth output 128). The result of the operation of system 100 provides an output signal at high bandwidth output 128 that is high bandwidth (due in part to Hall group H1 115), low offset (due in part to Hall group H2 119), and includes active gain calibration (due in part to gain calibration module 142 and bias control path 144). The output signal at high bandwidth output 128 indicates whether the Hall sensor system detects a magnetic field at the Hall sensor.

Figure 2:
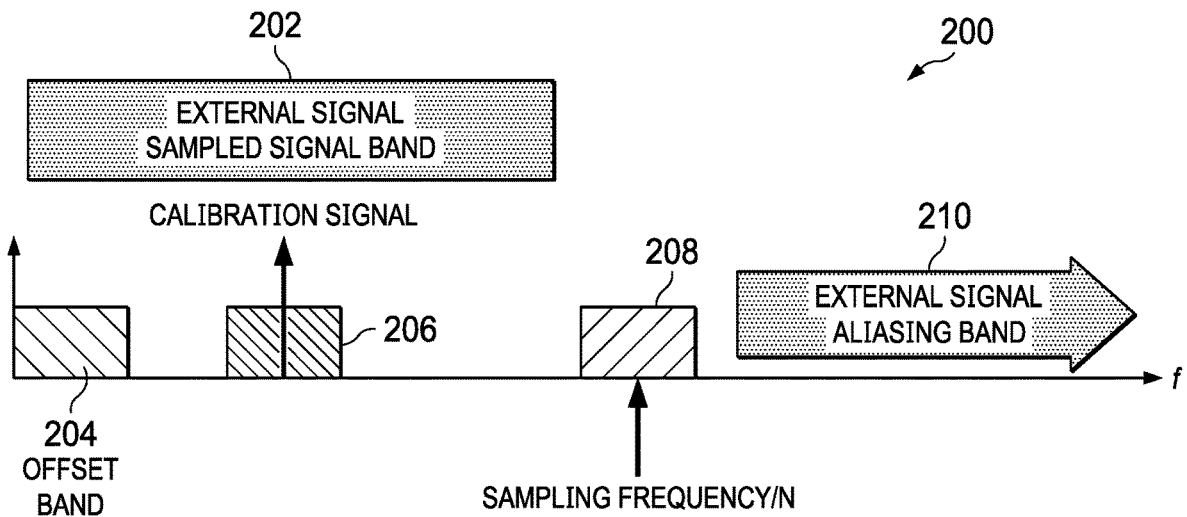
FIG. 2 is a frequency graph of signals in a Hall sensor system in accordance with various examples.

FIG. 2 is an example of a frequency graph 200 of various signals and signal bands of a Hall sensor system, such as system 100, according to examples. As shown in frequency graph 200, frequency band 202 includes the external signal sampled signal band. The external signal sampled signal band 202 includes the low frequency magnetic signal that is detected by each of the Hall groups H1 115 and H2 119 described above. This signal band is propagated through both the high bandwidth, high offset path and the low bandwidth, low offset path as described above. If these two paths include the same (or substantially similar) gain, subtractor 134 removes the external signal sampled signal band 202 by performing the subtraction operation. Therefore, the signal at the output of subtractor 134 has no low frequency external magnetic field.

Offset signal 204 is shown on frequency graph 200 and includes a low frequency signal. Offset signal 204 is used to offset cancel as described above with respect to system 100. Calibration signal 206 is also shown. Offset signal 204 and calibration signal 206 are at separate frequencies in this example, with calibration signal 206 located at a higher frequency than offset signal 204. Calibration signal 206 is used to perform gain calibration as also described above.

Frequency graph 200 further includes sampling frequency 208. Sampling frequency 208 is the frequency at which sampling of the signal occurs in SDI-1 130 and SDI-2 132, in one example. In another example, sampling frequency is similar to the spinning frequency of the spinning Hall sensor. Because sampling and integration is performed on the signals in the high bandwidth path and on signals in the low bandwidth path, aliasing may occur. Aliasing of the high frequency magnetic signal may be seen on both paths at the outputs of SDI-1 130 and SDI-2 132. This external signal aliasing band is shown as band 210. If SDI-1 130 and SDI-2 132 are matched, the same aliasing will occur on both the high bandwidth path and the low bandwidth path. If SDI-1 130 and SDI-2 132 are not matched, the aliasing on each path may be different. If SDI-1 130 and SDI-2 132 are matched, and after the signals of the high bandwidth path and the low bandwidth path are subtracted by subtractor 134, the external signal aliasing cancels and does not exist at the output of subtractor 134. Therefore as long as the high bandwidth path and the low bandwidth path have similar gain, no interference occurs at node 136. If gain mismatch exists between the two paths, additional steps may be taken to compensate for the mismatch in some examples, as described below.

Figure 3:
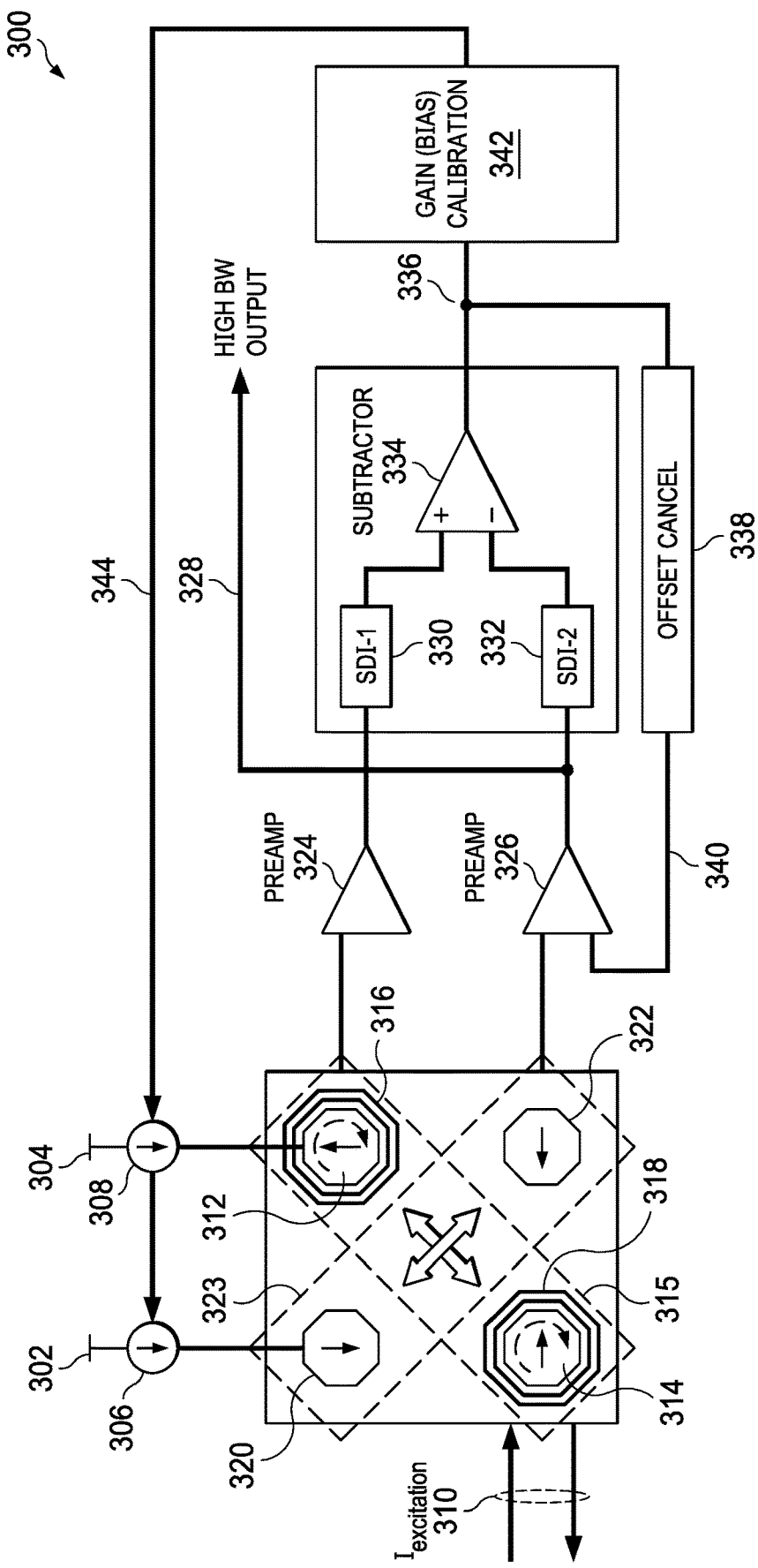
FIG. 3 is a schematic diagram of a Hall sensor system in accordance with various examples.

FIG. 3 is an example of a Hall sensor system 300 that includes a spinning Hall sensor group, a non-spinning Hall sensor group, and calibration circuitry according to one example. The structure and operation of system 300 are similar to that of system 100 described in FIG. 1 above, with some differences. In this example of system 300, four octagonal shaped Hall sensors are shown. In other examples, an array of more or fewer Hall sensors are used, and/or Hall sensors with different shapes are used, such as cross-shaped, square-shaped, circular, octagonal, etc. System 300 includes voltage sources 302 and 304 that are coupled to bias current sources 306 and 308, respectively. Bias current source 308 provides a first bias current I1 while bias current source 306 provides a second bias current I2. First bias current I1 is approximately equal to second bias current I2. Excitation signal 310 produces a calibrated magnetic field that impinges on certain Hall sensors to produce a calibration signal. The excitation signal 310 may be produced by any suitable mechanism, such as a coil coupled to an AC current source in one example.

System 300 further includes a first Hall group H1 315. Hall group H1 315 includes two Hall sensors 312 and 314.

Hall group H1 315 includes spinning matching Hall sensors 312, 314. Hall sensor 312 is surrounded by a separate coil 316. Excitation signal 310 drives coil 316 to produce a calibrated magnetic field that impinges on Hall sensor 312 to produce a low bandwidth calibration signal (in conjunction with Hall sensor 314). Similarly, Hall sensor 314 is surrounded by a separate coil 318. Excitation signal 310 also drives coil 318 to produce a calibrated magnetic field that impinges on Hall sensor 314 to produce the low bandwidth calibration signal (in conjunction with Hall sensor 312). The low bandwidth calibration signal also has a low offset voltage, due to the spinning technique employed by Hall sensors 312 and 314. Coils 316 and 318 may be fabricated on one or more conductive layers, such as metallic layers, that may be formed over the Hall sensors 312, 314. Coils 316 and 318 may be fabricated and positioned as described above with respect to FIG. 1 in some examples.

System 300 further includes a second Hall group H2 323. Hall group H2 323 includes two Hall sensors 320 and 322. Hall group H2 323 includes non-spinning matching Hall sensors 320 and 322. Non-spinning Hall sensors 320 and 322 provide a high bandwidth output signal in the presence of a magnetic field. However, the high bandwidth output signal also includes a high voltage offset.

System 300 further includes preamplifier 324, preamplifier 326, high bandwidth output 328, SDI-1 330, SDI-2 332, subtractor 334, node 336, offset cancellation module 338, offset cancellation path 340, gain calibration module 342, and bias control path 344. These components operate in a similar manner to their counterpart components described above with respect to FIG. 1. In system 300, however, the low bandwidth, low offset output from Hall group H1 315 is provided to an input of preamplifier 324. The high bandwidth, high offset output from Hall group H2 323 is provided to an input of preamplifier 326.

In system 300, the low bandwidth, low offset path includes Hall group H1 315 (the spinning Hall group), preamplifier 324, and SDI-1 330. The high bandwidth, high offset path includes Hall group H2 323 (the non-spinning Hall group), preamplifier 326, and SDI-2 332. Therefore the offset cancellation path 340 that carries the offset cancellation signal is coupled to an input of preamplifier 326. Accordingly, the high bandwidth output 328 is coupled to the output terminal of preamplifier 326. The output signal at high bandwidth output 328 indicates whether the Hall sensor system 300 detects a magnetic field at the Hall sensor. The detection of the magnetic field as indicated by the output signal can be used for any suitable application in various examples. Also, in system 300, the feedback signal from gain calibration module 342 along bias control path 344 adjusts bias current source 308, where bias current source 308 provides a bias current to the spinning Hall group H1 315 (in contrast to system 100, where bias current source 108 provided a bias current to the non-spinning Hall group H1 315).

As shown by a comparison of systems 100 and 300, either Hall group H1 315 or H2 323 can include the spinning Hall group. The spinning Hall group provides the low bandwidth, low offset signal while the non-spinning Hall group provides the high bandwidth, high offset signal. The result of the operation of system 300 provides an output signal at high bandwidth output 328 that is high bandwidth, low offset, and includes active gain calibration.

Figure 4:
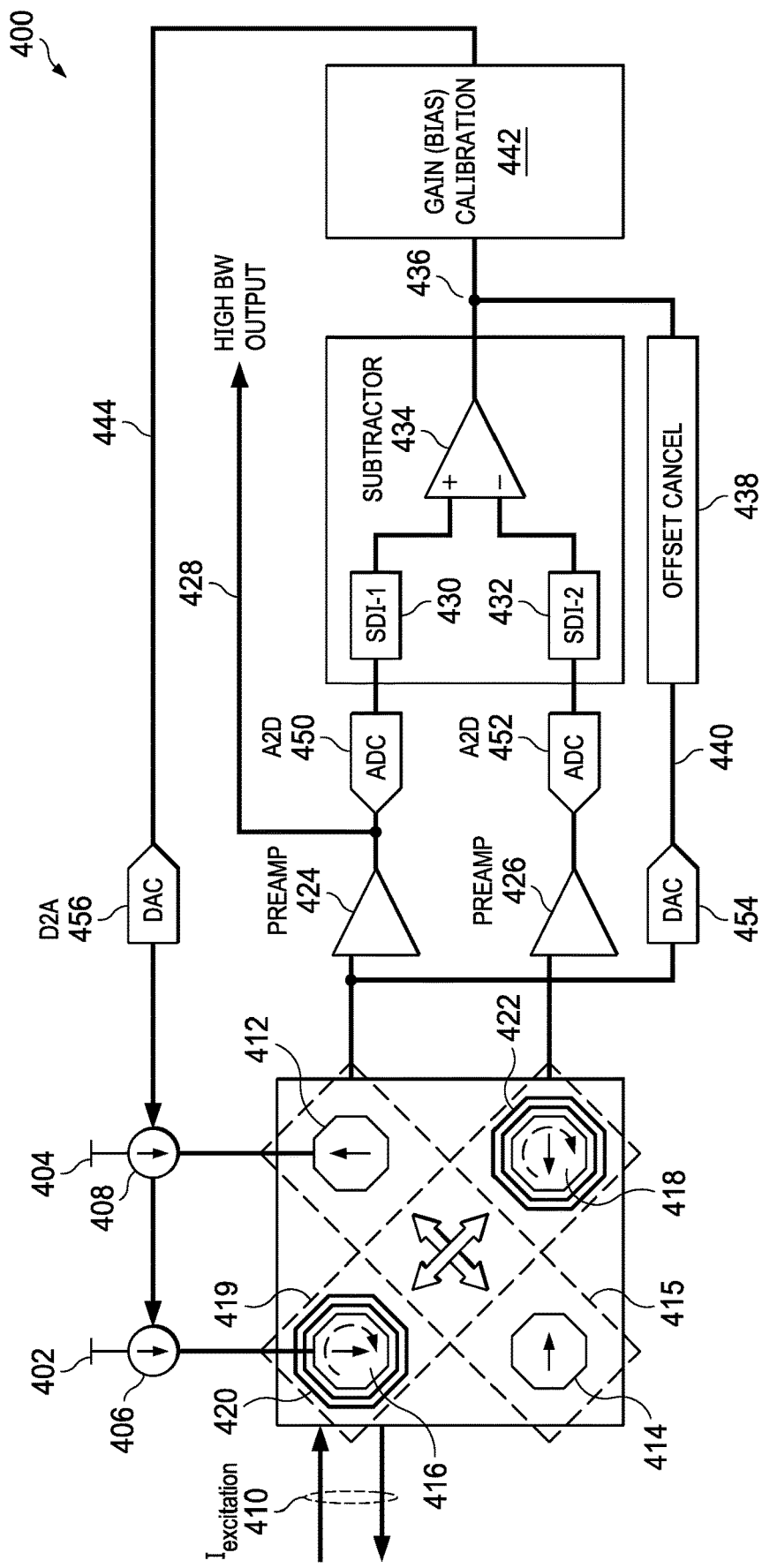
FIG. 4 is a schematic diagram of a Hall sensor system in accordance with various examples.

FIG. 4 is an example of a Hall sensor system 400 that includes a spinning Hall sensor group, a non-spinning Hall sensor group, and calibration circuitry according to one example. The structure and operation of system 400 are similar to that of system 100 described in FIG. 1 above, with a few differences. System 400 includes voltage sources 402 and 404 that are coupled to bias current sources 406 and 408, respectively. Bias current source 408 provides a first bias current I1 while bias current source 406 provides a second bias current I2. First bias current I1 is approximately equal to second bias current I2. Excitation signal 410 produces a calibrated magnetic field that impinges on certain Hall sensors to produce a calibration signal.

System 400 further includes a first Hall group H1 415 that includes two Hall sensors 412 and 414. Hall group H1 415 includes non-spinning matching Hall sensors 412, 414. System 400 also includes a second Hall group H2 419 that includes two Hall sensors 416 and 418. Hall group H2 419 includes spinning matching Hall sensors 416, 418. Hall sensor 416 is surrounded by a separate coil 420, and Hall sensor 418 is surrounded by a separate coil 422. Coils 420 and 422 may be fabricated and positioned as described above with respect to FIG. 1 in some examples.

System 400 includes preamplifier 424, preamplifier 426, high bandwidth output 428, SDI-1 430, SDI-2 432, subtractor 434, node 436, offset cancellation module 438, offset cancellation path 440, gain calibration module 442, and bias control path 444. These components operate in a similar manner to their counterpart components described above with respect to FIG. 1.

System 100 in FIG. 1 includes a fully analog implementation. System 400 in FIG. 4 implements a partly digital implementation of a Hall sensor analog front end. In some examples, a digital implementation makes signal processing with long time constraints easier. The partly digital implementation is achieved with a strategic positioning of analog to digital converters (ADC) 450 and 452, and digital to analog converters (DAC) 454 and 456. In system 400, the high bandwidth, high offset signal from the output of preamplifier 424 is converted from an analog signal to a digital signal by ADC 450. The digital signal provided by ADC 450 is provided to SDI-1 430 for sampling, demodulation, and integration. Similarly, the low bandwidth, low offset signal from the output of preamplifier 426 is converted from an analog signal to a digital signal by ADC 452. The digital signal output provided by ADC 452 is provided to SDI-2 432 for sampling, demodulation, and integration.

Subtractor 434 operates on the digital signals received from the outputs of SDI-1 430 and SDI-2 432. Subtractor 434 then provides a digital signal that is provided to offset cancellation module 438 and gain calibration module 442. Offset cancellation module 438 provides a digital result, and DAC 454 converts the digital result to an analog signal. The analog signal that is provided by DAC 454 is provided to preamplifier 424 for offset cancellation.

Gain calibration module 442 receives a digital signal from subtractor 434 and provides a digital signal for gain calibration. DAC 456 receives the digital signal from gain calibration module 442 and provides an analog signal. The analog signal that is provided by DAC 456 is used to adjust bias current source 408 to provide gain calibration. Bias current source 406 is configured to match bias current source 408. As system 400 operates, the output signal at high bandwidth output 428 indicates whether the Hall sensor system 400 detects a magnetic field at the Hall sensor.

Figure 5:
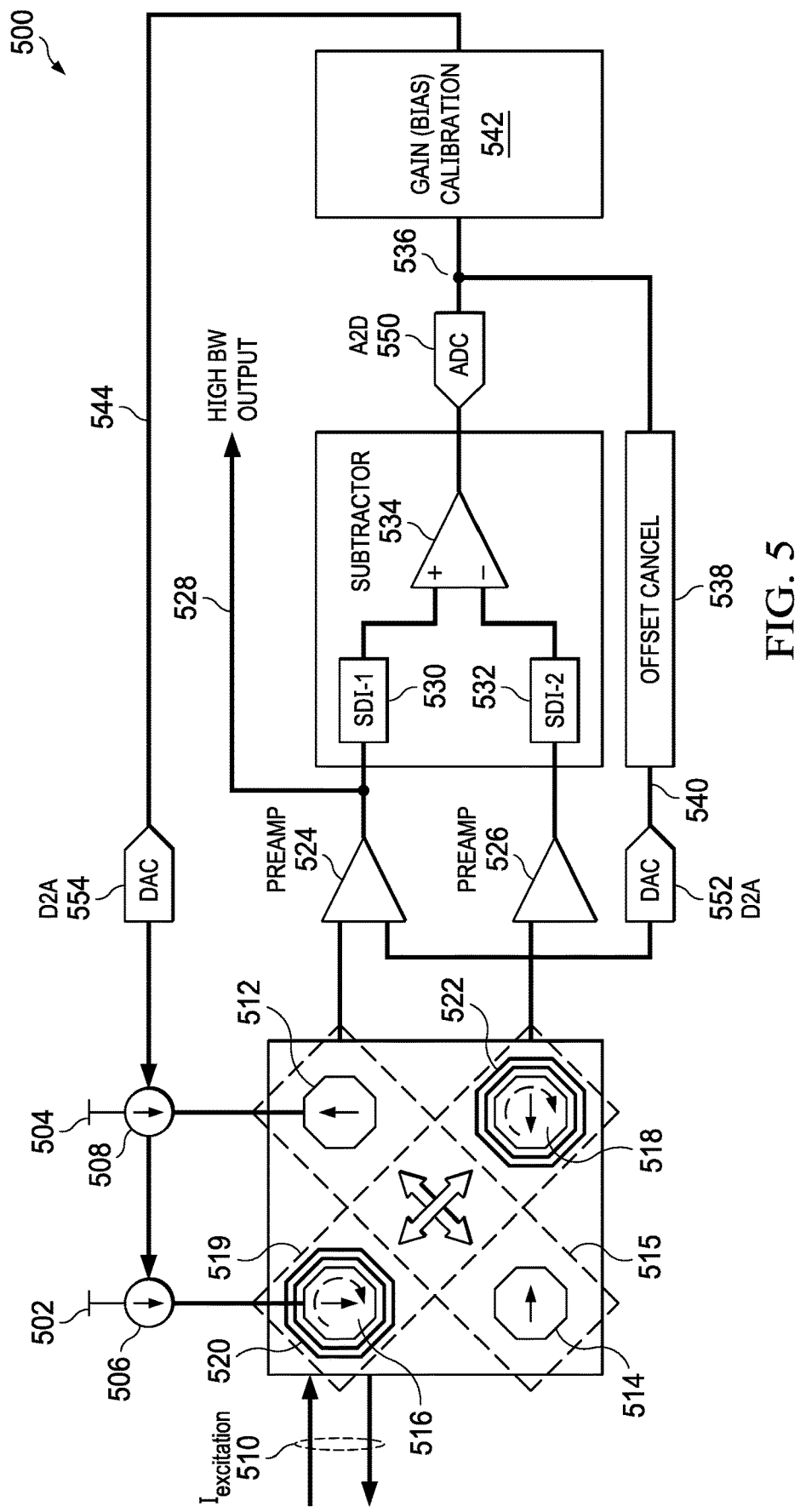
FIG. 5 is a schematic diagram of a Hall sensor system in accordance with various examples.

FIG. 5 is an example of a Hall sensor system 500 that includes a spinning Hall sensor group, a non-spinning Hall sensor group, and calibration circuitry according to one example. The structure and operation of system 500 are similar to that of system 100 described in FIG. 1 above, except system 500 includes a partly digital implementation.

System 500 includes voltage sources 502 and 504, current sources 506 and 508, and excitation signal 510.

System 500 further includes a first Hall group H1 515 that includes two non-spinning matching Hall sensors 512 and 514. System 500 also includes a second Hall group H2 519 that includes two spinning matching Hall sensors 516 and 518. Hall sensor 516 is surrounded by a separate coil 520, and Hall sensor 518 is surrounded by a separate coil 522. Coils 520 and 522 may be fabricated and positioned as described above with respect to FIG. 1 in some examples.

System 500 further includes preamplifier 524, preamplifier 526, high bandwidth output 528, SDI-1 530, SDI-2 532, subtractor 534, node 536, offset cancellation module 538, offset cancellation path 540, gain calibration module 542, and bias control path 544. These components operate in a similar manner to their counterpart components described above with respect to FIG. 1.

System 100 in FIG. 1 includes a fully analog implementation. System 500 in FIG. 5 implements a partly digital implementation of a Hall sensor analog front end. The partly digital implementation is achieved with a strategic positioning of ADC 550, DAC 552, and DAC 554. In system 500, the preamplifiers 524 and 526, the SDI-1 530 and SDI-2 532, and subtractor 534 operate on analog signals. Subtractor 534 provides an analog signal, and that analog signal is converted to a digital signal by ADC 550.

ADC 550 provides a digital signal to offset cancellation module 538 and gain calibration module 542. Offset cancellation module 538 provides a digital result, and DAC 552 converts the digital result to an analog signal. The analog signal that is provided by DAC 552 is provided to preamplifier 524 for offset cancellation.

Gain calibration module 542 receives a digital signal from ADC 550 and provides a digital signal for gain calibration. DAC 554 receives the digital signal from gain calibration module 542 and provides an analog signal. The analog signal that is provided by DAC 554 is used to adjust bias current sources 508 and 506 to provide gain calibration. As system 500 operates, the output signal at high bandwidth output 528 indicates whether the Hall sensor system 500 detects a magnetic field at the Hall sensor.

Figure 6:
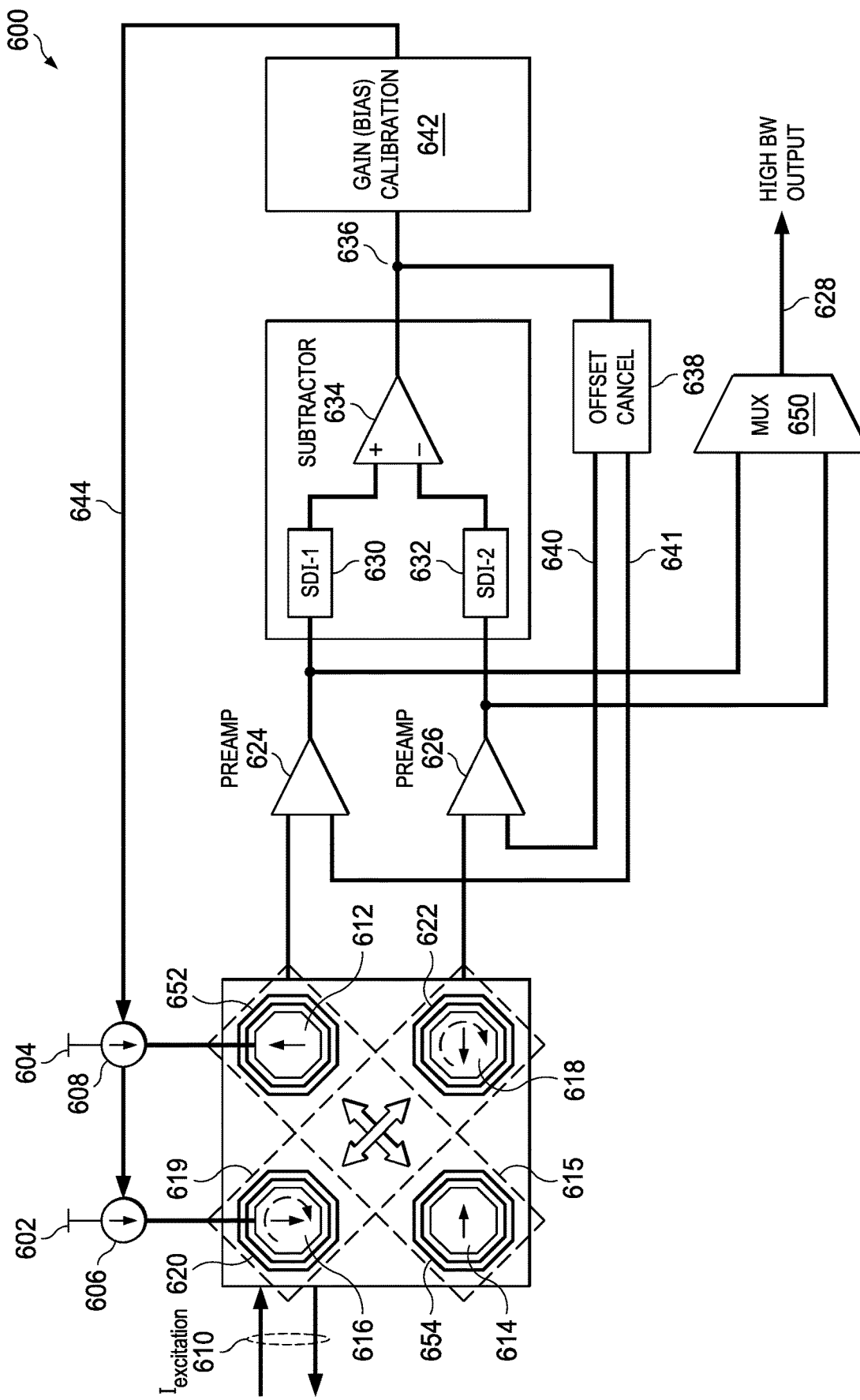
FIG. 6 is a schematic diagram of a Hall sensor system in accordance with various examples.

FIG. 6 is an example of a Hall sensor system 600 according to one example. The structure and operation of system 600 are similar to that of system 100 described in FIG. 1 above, except system 600 includes a multiplexer 650 to select between the spinning Hall group and the non-spinning Hall group. As described above with respect to FIGS. 1 and 2, if the Hall groups H1 115 and H2 119 are matched, the external magnetic field is cancelled by subtractor 134 from both the high bandwidth path and the low bandwidth path. However, if a mismatch exists in the Hall groups H1 115 and H2 119, the external magnetic field is only partially removed. By toggling between the spinning Hall group and the non-spinning Hall group using multiplexer 650, the residual external magnetic field can be canceled. In one example, multiplexer 650 is controlled by the control signal that also controls the toggling of Hall groups from spinning to non-spinning. Multiplexer 650 allows system 600 to switch between the output 128 of system 100 of FIG. 1 and the output 328 of system 300 of FIG. 3. In system 100, the high bandwidth output 128 is coupled to the output of preamplifier 124, while in system 300 the high bandwidth output 328 is coupled to the output of preamplifier 326. In system 600, the output of either preamplifier 624 or preamplifier 626 may be selected. If an external magnetic field is present at the time the first output is selected, an interference signal representing the difference in gain ($\Delta G$) times the value of the external field ($B_{ext}$) is provided in the signal path (e.g., $\Delta GB_{ext}$). If the same external magnetic field is present at the time the second output is selected, an interference signal representing the difference in gain ($-\Delta G$) times the value of the external field ($B_{ext}$) is provided in the signal path (e.g., $-\Delta GB_{ext}$). If these two signals are combined, the external magnetic field is canceled ($\Delta GB_{ext}+(-\Delta GB_{ext})=0$). Therefore the use of multiplexer 650 provides immunity for a system with a gain mismatch. Any gain mismatch is canceled in system 600.

System 600 includes voltage sources 602 and 604, current sources 606 and 608, and excitation signal 610. System 600 further includes a first Hall group H1 615 that includes two non-spinning matching Hall sensors 612 and 614. In this example, Hall sensor 612 is surrounded by coil 652 and Hall sensor 614 is surrounded by coil 654. System 600 also includes a second Hall group H2 619 that includes two spinning matching Hall sensors 616 and 618. Hall sensor 616 is surrounded by a separate coil 620, and Hall sensor 618 is surrounded by a separate coil 622. Coils 620, 622, 652 and 654 may be fabricated and positioned as described above with respect to FIG. 1 in some examples.

System 600 further includes high bandwidth output 628, SDI-1 630, SDI-2 632, subtractor 634, node 636, offset cancellation module 638, offset cancellation paths 640 and 641, gain calibration module 642, and bias control path 644. These components operate in a similar manner to their counterpart components described above with respect to FIG. 1. In system 600, high bandwidth output 628 is provided by multiplexer 650. The output signal at high bandwidth 628 indicates whether the Hall sensor system 600 detects a magnetic field at the Hall sensor.

Multiplexer 650 selects between Hall group H1 615 and Hall group H2 619. Multiplexer 650 selects either the output from preamplifier 624 (the non-spinning Hall group H1 615) or the output from preamplifier 626 (the spinning Hall group H2 619) as described above. The use of multiplexer 650 provides immunity to gain mismatch in system 600.

Figure 7:
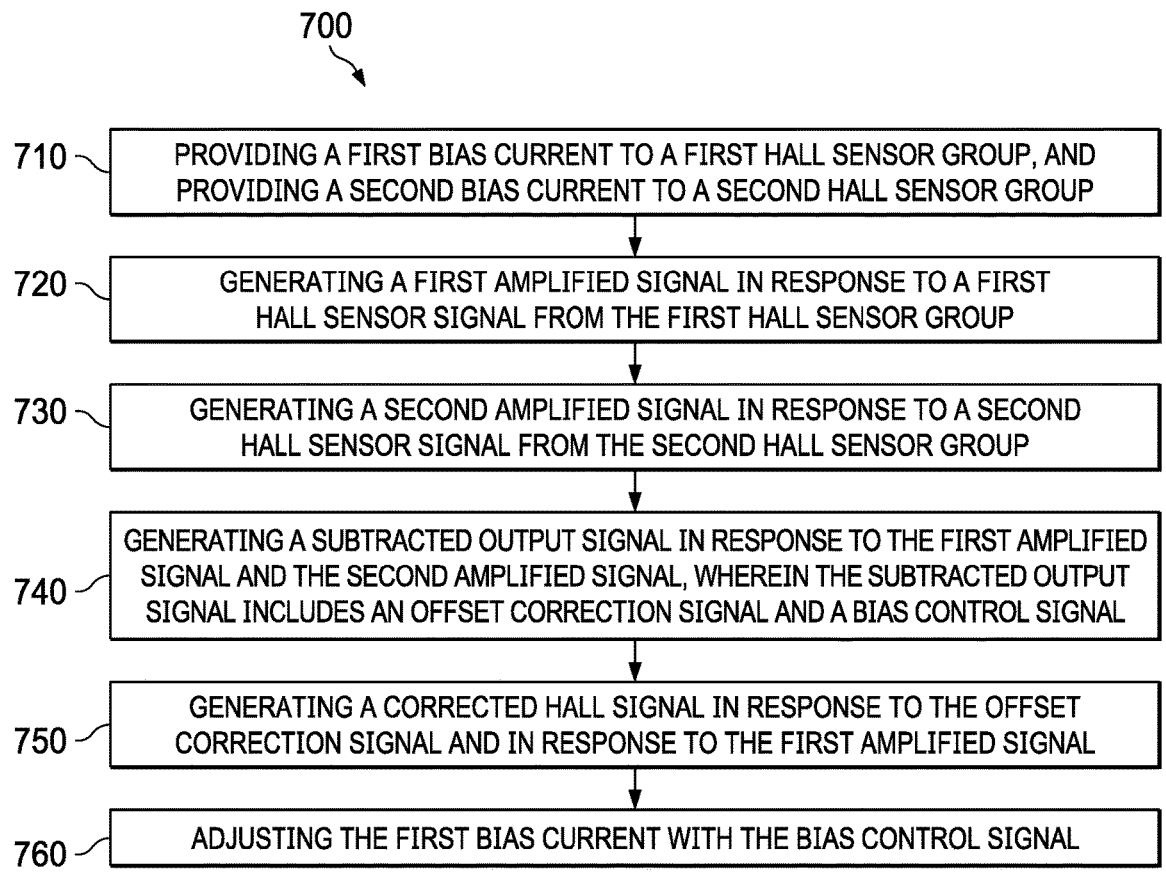
FIG. 7 is a flowchart of an example method for operating a Hall sensor in accordance with various examples.

FIG. 7 is a flowchart of an example method for operating a Hall sensor. Although the method steps are described in conjunction with FIGS. 1-6, any system configured to perform the method steps, in any suitable order, is within the scope of this description.

Method 700 begins at step 710, where a first bias current source provides a first bias current to a first Hall sensor group, and a second bias current source provides a second bias current to a second Hall sensor group. For example, in system 100 shown in FIG. 1, bias current source 108 provides a first bias current I1 to a first Hall sensor group H1 115. Likewise, second bias current source 106 provides a second bias current I2 to second Hall sensor group H2 119. In one example, bias current source 108 matches second bias current source 106, therefore first bias current I1 is approximately equal to second bias current I2.

Method 700 continues at step 720, where a first amplifier provides a first amplified signal responsive to a first Hall sensor signal from the first Hall sensor group. As shown in system 100, preamplifier 124 receives the Hall sensor signal from the first Hall group H1 115 and provides an amplified signal.

Method 700 continues at step 730, where a second amplifier provides a second amplified signal responsive to a second Hall sensor signal from the second Hall sensor group. As shown in system 100, preamplifier 126 receives the Hall sensor signal from the second Hall group H2 119 and provides an amplified signal.

Method 700 continues at step 740, where a subtractor provides a subtracted output signal responsive to the first amplified signal and the second amplified signal, where the subtracted output signal includes an offset correction signal and a bias control signal. In system 100 the first amplified signal and the second amplified signal are sampled, demodulated, and integrated before being provided to subtractor 134. Subtractor 134 could include a differential amplifier in some examples.

Method 700 continues at step 750, wherein an amplifier provides a corrected Hall signal responsive to the offset correction signal and responsive to the first amplified signal. In system 100, preamplifier 124 receives the offset correction signal via offset cancellation path 140 and uses the offset correction signal to correct the offset of the first Hall sensor signal from Hall group H1 115.

Method 700 concludes at step 760, where the first bias current is adjusted with the bias control signal. In system 100, gain calibration module 142 provides a bias control signal that is fed back to bias current source 108 via bias control path 144. The bias control signal controls bias current source 108 in a manner that adjusts the magnitude of the first bias current I1 provided by bias current source 108. Also, bias current source 106 is configured to match bias current source 108 and adjust the output of bias current source 106.

In this description, the term "couple" may cover connections, communications, or signal paths that enable a functional relationship consistent with this description. For example, if device A generates a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

Modifications are possible in the described examples, and other examples are possible, within the scope of the claims.

What is claimed is:

1. A system, comprising:
   a first amplifier having a first amplifier output and first and second inputs;
   a first Hall sensor group coupled to the first input of the first amplifier;
   a second amplifier having a second amplifier output and a third input;
   a second Hall sensor group coupled to the third input, wherein the second Hall sensor group includes a spinning Hall group;
   a first demodulator having a first demodulator output and a first demodulator input, the first demodulator input coupled to the first amplifier output;
   a second demodulator having a second demodulator output and a second demodulator input, the second demodulator input coupled to the second amplifier output;
   a subtractor having a subtractor output and first and second subtractor inputs, the first subtractor input coupled to the first demodulator output, and the second subtractor input coupled to the second demodulator output;
   a filter coupled to the subtractor output and to the second input of the first amplifier; and
   a calibration module coupled to the subtractor output.

2. The system of claim 1, wherein the filter is a low-pass filter.

3. The system of claim 1, further comprising a multiplexer having first and second multiplexer inputs, the first multiplexer input coupled to the first amplifier output, and the second multiplexer input coupled to the second amplifier output.

4. The system of claim 1, wherein the calibration module has a calibration module output coupled to a bias current source, the bias current source coupled to the first Hall sensor group.

5. The system of claim 1, wherein the first Hall sensor group includes a spinning Hall group.

6. A system, comprising:
   a first Hall sensor group configured to provide a first Hall sensor signal responsive to an applied magnetic field;
   a second Hall sensor group configured to provide a second Hall sensor signal responsive to the applied magnetic field, wherein the second Hall sensor group includes a spinning Hall group;
   a first amplifier coupled to the first Hall sensor group and configured to provide a first amplified signal responsive to the first Hall sensor signal;

a second amplifier coupled to the second Hall sensor group and configured to provide a second amplified signal responsive to the second Hall sensor signal;

a first demodulator coupled to the first amplifier and configured to provide a first demodulated signal responsive to the first amplified signal;

a second demodulator coupled to the second amplifier and configured to provide a second demodulated signal responsive to the second amplified signal;

a third amplifier coupled to the first demodulator and the second demodulator, and configured to provide a subtracted output signal responsive to a difference between the first demodulated signal and the second demodulated signal;

a filter coupled to an output of the third amplifier and configured to provide an offset correction signal to the first amplifier responsive to the subtracted output signal; and a calibration module coupled to the output of the third amplifier and configured to provide a calibration signal responsive to the subtracted output signal, wherein the calibration signal is configured to calibrate a bias current source coupled to the first Hall sensor group.

7. The system of claim 6, wherein the second Hall sensor signal includes an offset lower than an offset of the first Hall sensor signal.

8. The system of claim 6, wherein a bandwidth of the first Hall sensor signal is higher than a bandwidth of the second Hall sensor signal.

9. The system of claim 6, wherein the filter is a low-pass filter.

10. The system of claim 6, wherein the bias current source is a first bias current source, and the calibration module is configured to provide the calibration signal to a second bias current source coupled to the second Hall sensor group.

11. The system of claim 6, wherein a bandwidth of the subtracted output signal is higher than a bandwidth of the second Hall sensor signal.

12. The system of claim 6, wherein an offset of the subtracted output signal is lower than an offset of the first Hall sensor signal.

13. The system of claim 6, wherein the first Hall sensor group includes a non-spinning Hall group.

14. The system of claim 6, wherein the first Hall sensor group includes two matched octagonal Hall sensors, and the second Hall sensor group includes two matched octagonal Hall sensors.

15. A system, comprising:
a first amplifier configured to provide a first amplified signal responsive to a first Hall sensor signal from a first Hall sensor group;

a second amplifier configured to provide a second amplified signal responsive to a second Hall sensor signal from a second Hall sensor group;

a first demodulator coupled to the first amplifier and configured to provide a first demodulated signal responsive to the first amplified signal;

a second demodulator coupled to the second amplifier and configured to provide a second demodulated signal responsive to the second amplified signal;

a third amplifier coupled to the first demodulator and the second demodulator and configured to provide a subtracted output signal responsive to the first demodulated signal and the second demodulated signal;

a filter coupled to the third amplifier and configured to provide an offset correction signal responsive to the subtracted output signal, wherein the offset correction signal is configured to correct the first amplifier;

a calibration module coupled to the third amplifier and configured to provide a calibration signal to a bias current source coupled to the first Hall sensor group responsive to the subtracted output signal; and a multiplexer configured to combine the first amplified signal and the second amplified signal and configured to provide an output signal.

16. The system of claim 15, wherein the multiplexer is configured to provide an output signal that compensates for a gain mismatch between the first demodulated signal and the second demodulated signal.

17. The system of claim 15, wherein the second Hall sensor signal includes an offset lower than an offset of the first Hall sensor signal.

18. The system of claim 15, wherein the first Hall sensor group includes a non-spinning Hall group, and the second Hall sensor group includes a spinning Hall group.

19. The system of claim 15, wherein a bandwidth of the first Hall sensor signal is higher than a bandwidth of the second Hall sensor signal.

20. A method, comprising:
providing a first bias current to a first Hall sensor group;
providing a second bias current to a second Hall sensor group;
providing a first amplified signal responsive to a first Hall sensor signal from the first Hall sensor group;
providing a second amplified signal responsive to a second Hall sensor signal from the second Hall sensor group;
providing a subtracted output signal responsive to a difference between the first amplified signal and the second amplified signal, wherein the subtracted output signal includes an offset correction signal and a bias control signal;
providing a corrected Hall signal responsive to the offset correction signal and responsive to the first amplified signal; and
adjusting the first bias current with the bias control signal.

21. The method of claim 20, wherein the first Hall sensor group is a non-spinning Hall sensor group, and the second Hall sensor group is a spinning Hall sensor group.

22. The method of claim 20, further comprising adjusting the second bias current with the bias control signal.

23. The method of claim 20, further comprising using a multiplexer to select an output signal from among the first and second amplified signals.

24. The method of claim 20, further comprising producing the first Hall sensor signal by exposing the first Hall sensor group to a magnetic field.

25. The method of claim 20, further comprising producing the second Hall sensor signal by exposing the second Hall sensor group to a calibrated magnetic field from an excitation coil.

* * * * *